(12) United States Patent
Cho et al.

(10) Patent No.: US 11,824,076 B2
(45) Date of Patent: Nov. 21, 2023

(54) SEMICONDUCTOR PACKAGE INCLUDING AN IMAGE SENSOR CHIP AND A METHOD OF FABRICATING THE SAME

(71) Applicant: Samsung Electronics Co., Ltd., Suwon-si (KR)

(72) Inventors: Yonghoe Cho, Bucheon-si (KR); Chungsun Lee, Anyang-si (KR); Yoonha Jung, Suwon-si (KR); Chajea Jo, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/731,022

(22) Filed: Apr. 27, 2022

(65) Prior Publication Data

US 2022/0254827 A1    Aug. 11, 2022

Related U.S. Application Data

(63) Continuation of application No. 16/802,683, filed on Feb. 27, 2020, now Pat. No. 11,335,719.

(30) Foreign Application Priority Data

Jul. 24, 2019    (KR) .......................... 10-2019-0089787

(51) Int. Cl.
*H01L 27/146*    (2006.01)
*H01L 23/00*    (2006.01)
(Continued)

(52) U.S. Cl.
CPC .... *H01L 27/14634* (2013.01); *H01L 21/6835* (2013.01); *H01L 23/481* (2013.01);
(Continued)

(58) Field of Classification Search
CPC ............... H01L 27/14634; H01L 24/32; H01L 27/14627; H01L 23/481; H01L 27/14623;
(Continued)

(56) References Cited

U.S. PATENT DOCUMENTS 7,569,409 B2    8/2009 Lin et al.
7,883,991 B1*   2/2011 Wu ..................... H01L 25/0657
                                                                 438/455
(Continued)

FOREIGN PATENT DOCUMENTS

JP    3955541 B2    8/2007
JP    5721370 B2    5/2015

*Primary Examiner* — Jonathan Han
(74) *Attorney, Agent, or Firm* — Muir Patent Law, PLLC

(57) ABSTRACT

Disclosed are a semiconductor package and a method of fabricating the same. The semiconductor package may include a semiconductor chip structure, a transparent substrate disposed on the semiconductor chip structure, a dam placed on an edge of the semiconductor chip structure and between the semiconductor chip structure and the transparent substrate, and an adhesive layer interposed between the dam and the semiconductor chip structure. The semiconductor chip structure may include an image sensor chip and a logic chip, which are in contact with each other, and the image sensor chip may be closer to the transparent substrate than the logic chip.

19 Claims, 17 Drawing Sheets

(51) Int. Cl.
*H01L 23/48* (2006.01)
*H01L 21/683* (2006.01)

(52) U.S. Cl.
CPC .......... *H01L 24/32* (2013.01); *H01L 27/1469* (2013.01); *H01L 27/14618* (2013.01); *H01L 27/14621* (2013.01); *H01L 27/14623* (2013.01); *H01L 27/14627* (2013.01); *H01L 27/14636* (2013.01); H01L 24/08 (2013.01); H01L 2224/08145 (2013.01); H01L 2224/32225 (2013.01); H01L 2924/1431 (2013.01); *H01L 2924/1434* (2013.01)

(58) Field of Classification Search
CPC .......... H01L 27/14621; H01L 27/14636; H01L 21/6835; H01L 27/1469; H01L 27/14618; H01L 2224/32225; H01L 2924/1431; H01L 2924/1434; H01L 24/08; H01L 2224/08145; H01L 2221/68327; H01L 2221/6834; H01L 21/6836; H01L 27/14683; H01L 2224/02372; H01L 2224/13024; H01L 2224/131; H01L 2224/29013; H01L 2224/29035; H01L 2224/73251; H01L 2224/80006; H01L 2224/80203; H01L 2224/94; H01L 2224/95; H01L 2224/96; H01L 2224/97; H01L 25/0657; H01L 23/13; H01L 23/31; H01L 23/58; H01L 2224/11; H01L 2224/08; H01L 2224/32; H01L 2924/014; H01L 2924/00014

See application file for complete search history.

(56) References Cited

U.S. PATENT DOCUMENTS

| | | | |
|---|---|---|---|
| 8,587,082 | B2 | 11/2013 | Yukawa et al. |
| 8,790,950 | B2* | 7/2014 | Suzuki ............. H01L 27/14618 438/64 |
| 9,419,033 | B2 | 8/2016 | Hsu et al. |
| 2014/0070348 | A1* | 3/2014 | Yee ................... H01L 27/14636 257/E31.127 |
| 2015/0163425 | A1 | 6/2015 | Oganesian et al. |
| 2016/0172399 | A1 | 6/2016 | Nakata |
| 2017/0186792 | A1 | 6/2017 | Chiu |
| 2018/0090524 | A1* | 3/2018 | Wang ...................... H01L 23/31 |
| 2018/0138225 | A1* | 5/2018 | Kim ................... H01L 27/14634 |
| 2018/0337142 | A1* | 11/2018 | Cheng ..................... H01L 23/04 |
| 2019/0019831 | A1 | 1/2019 | Takachi |

* cited by examiner

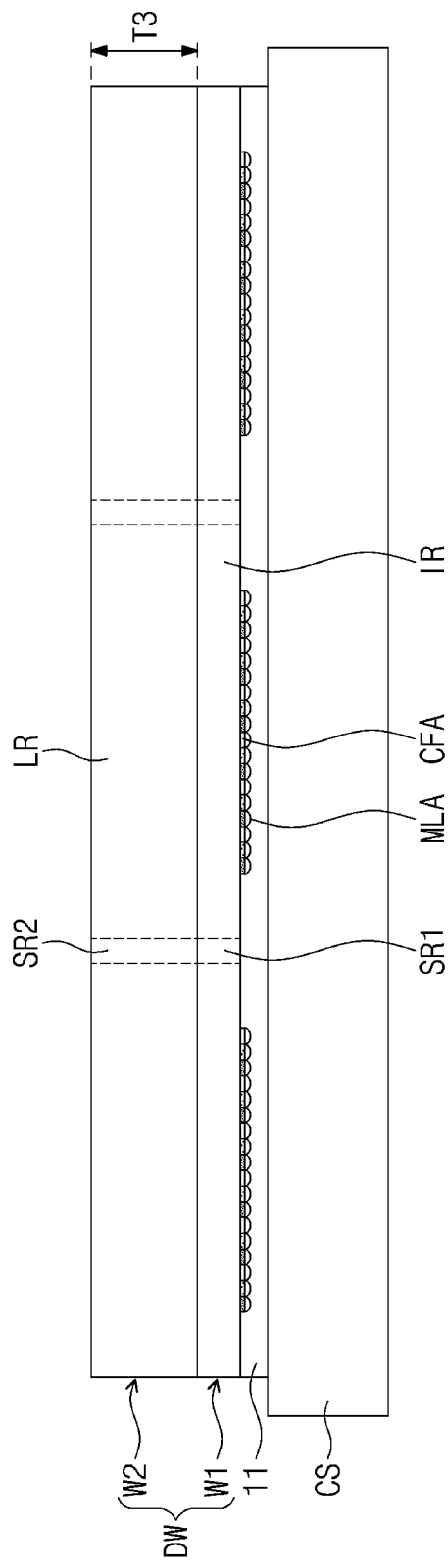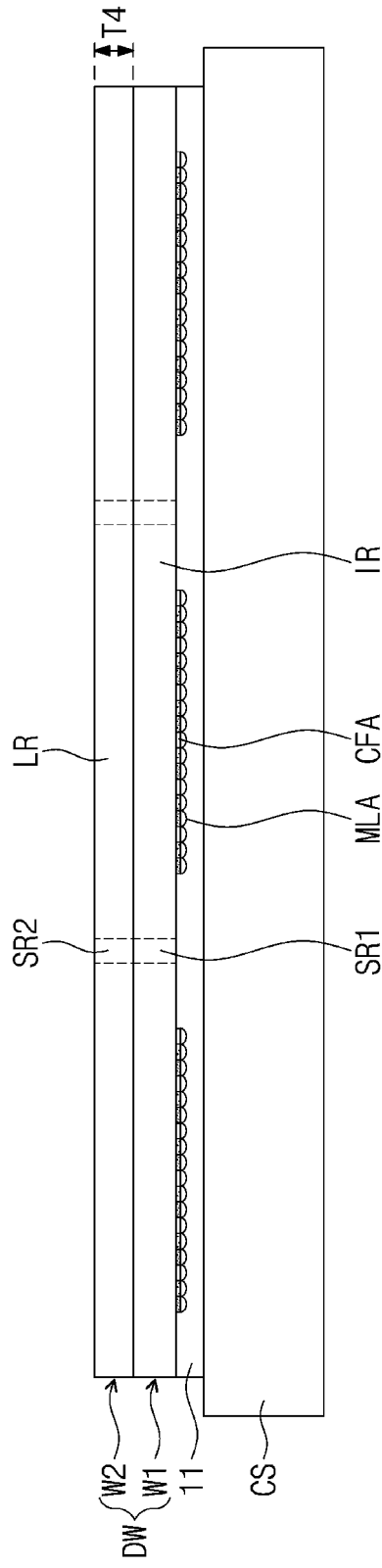

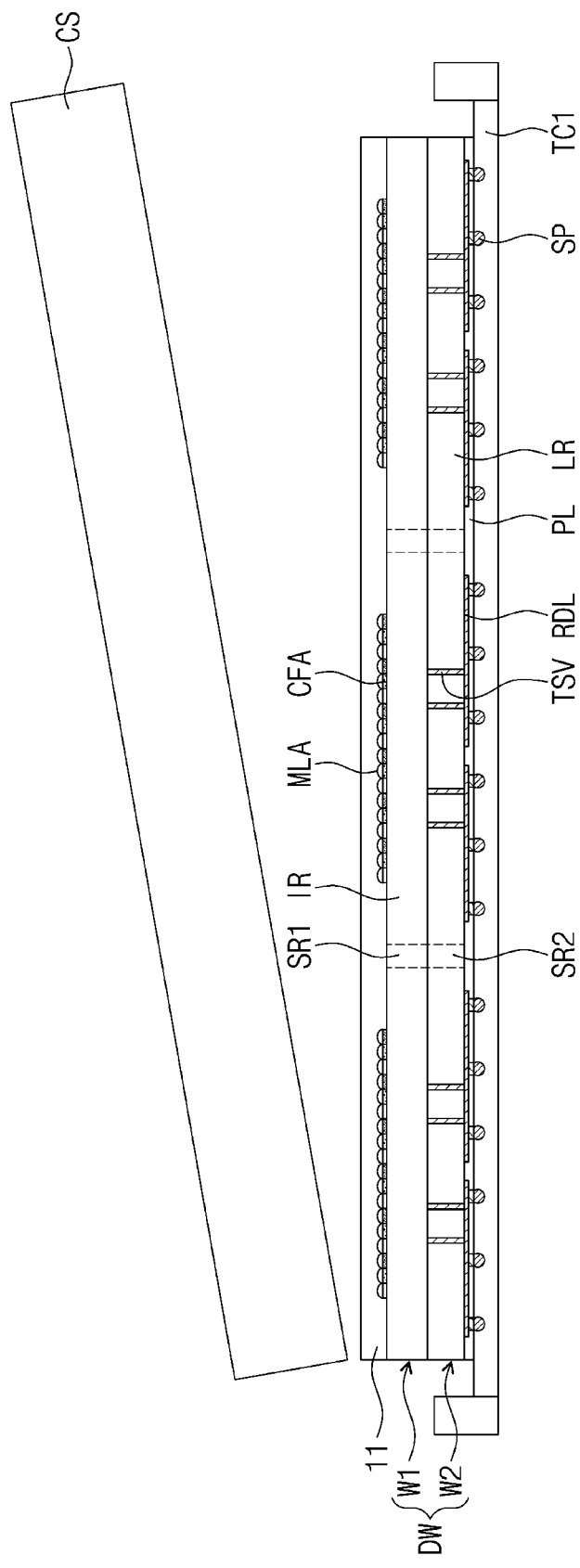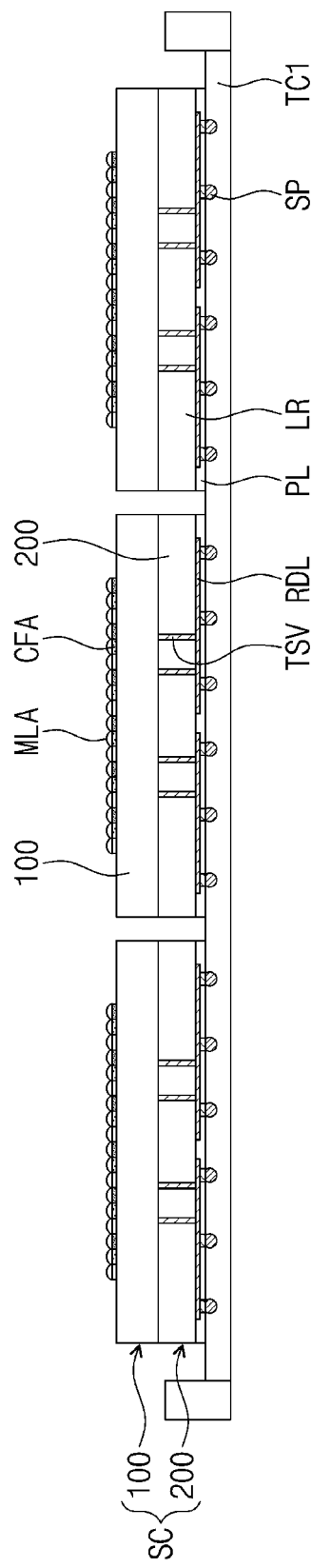

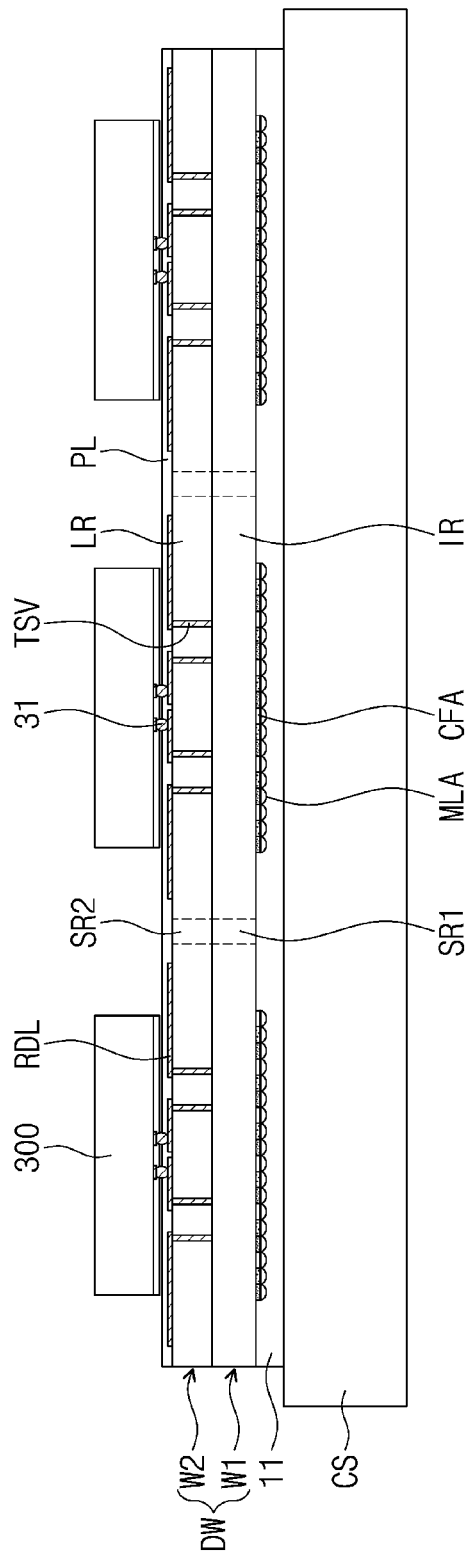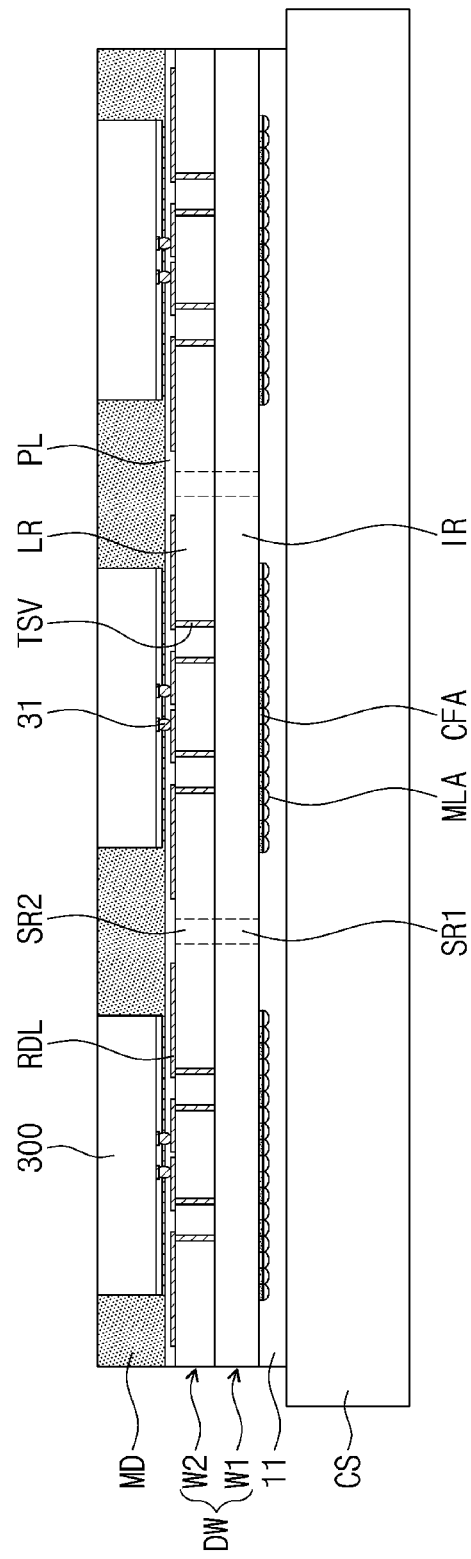

SEMICONDUCTOR PACKAGE INCLUDING AN IMAGE SENSOR CHIP AND A METHOD OF FABRICATING THE SAME

CROSS-REFERENCE TO RELATED APPLICATIONS

This application is a continuation of U.S. application Ser. No. 16/802,683 filed Feb. 27, 2020, which claims priority under 35 U.S.C. § 119 to Korean Patent Application No. 10-2019-0089787, filed on Jul. 24, 2019, in the Korean Intellectual Property Office, the entire contents of each of these applications being hereby incorporated by reference.

BACKGROUND OF THE INVENTION

The present disclosure relates to a semiconductor package and a method of fabricating the same, and in particular, to a semiconductor package including an image sensor chip and a method of fabricating the same.

Image sensors (e.g., a charge-coupled device (CCD) sensor or a complementary metal-oxide-semiconductor (CMOS) image sensor) have been applied to various electronic products, such as mobile phones, digital cameras, optical mice, security cameras, biometric devices. Due to an increasing demand for small and multifunctional electronic products, semiconductor packages including image sensors with improved technical properties (e.g., small size, high density, low power consumption, multifunction, high signal-processing speed, high reliability, low cost, and clear image quality) are demanded. Various researches are being conducted to realize such technical properties of semiconductor packages.

SUMMARY

An embodiment of the inventive concept provides a semiconductor package with an increased signal transmission speed.

An embodiment of the inventive concept provides a method of simplifying a process of fabricating a semiconductor package and increasing a production yield.

According to an embodiment of the inventive concept, a semiconductor package may include a semiconductor chip structure, a transparent substrate disposed on the semiconductor chip structure, a dam placed on an edge of the semiconductor chip structure and between the semiconductor chip structure and the transparent substrate, and an adhesive layer interposed between the dam and the semiconductor chip structure. The semiconductor chip structure may include an image sensor chip and a logic chip, which are in contact with each other. The image sensor chip may be closer to the transparent substrate than the logic chip. Widths of the image sensor chip and the logic chip may be less than a width of the transparent substrate.

According to an embodiment of the inventive concept, a semiconductor package may include a semiconductor chip structure, a transparent substrate disposed on the semiconductor chip structure, a dam disposed on an edge of the semiconductor chip structure and between the semiconductor chip structure and the transparent substrate, and an adhesive layer interposed between the dam and the semiconductor chip structure. The semiconductor chip structure may include an image sensor chip and a logic chip, which are in contact with each other. The image sensor chip may be closer to the transparent substrate than the logic chip. Widths of the image sensor chip and the logic chip may be less than a width of the transparent substrate. The semiconductor chip structure may have a thickness of 10 μm-100 μm, and the transparent substrate may have a thickness of 200 μm-300 μm.

According to an embodiment of the inventive concept, a semiconductor package may include a semiconductor chip structure, a transparent substrate disposed on the semiconductor chip structure, a dam placed on an edge of the semiconductor chip structure and between the semiconductor chip structure and the transparent substrate, and an adhesive layer interposed between the dam and the semiconductor chip structure. The semiconductor chip structure may include an image sensor chip and a logic chip, which are in contact with each other. The image sensor chip may be closer to the transparent substrate than the logic chip. Widths of the image sensor chip and the logic chip may be less than a width of the transparent substrate. The image sensor chip may include a micro lens array, which is provided in a center region thereof, and a light-shielding pattern, which is provided in an edge region thereof and encloses the micro lens array in a plan view. The adhesive layer may be in contact with the light-shielding pattern.

According to an embodiment of the inventive concept, a method of fabricating a semiconductor package may include preparing a semiconductor chip structure including an image sensor chip and a logic chip, which are in contact with each other, forming a dam on a transparent substrate, forming an adhesive layer on the dam, attaching the semiconductor chip structure on the dam using the adhesive layer, and cutting the transparent substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4A to 4F are sectional views sequentially illustrating a process of fabricating a semiconductor chip, according to an embodiment of the inventive concept.

FIGS. 9A to 9C are sectional views sequentially illustrating a process of fabricating the semiconductor package of FIG. 8.

It should be noted that these figures are intended to illustrate the general characteristics of methods, structure and/or materials utilized in certain example embodiments and to supplement the written description provided below. These drawings are examples, and should not be interpreted as defining or limiting the range of values or properties encompassed by example embodiments. For example, the relative thicknesses and positioning of molecules, layers, regions and/or structural elements may vary in different embodiments. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1A:
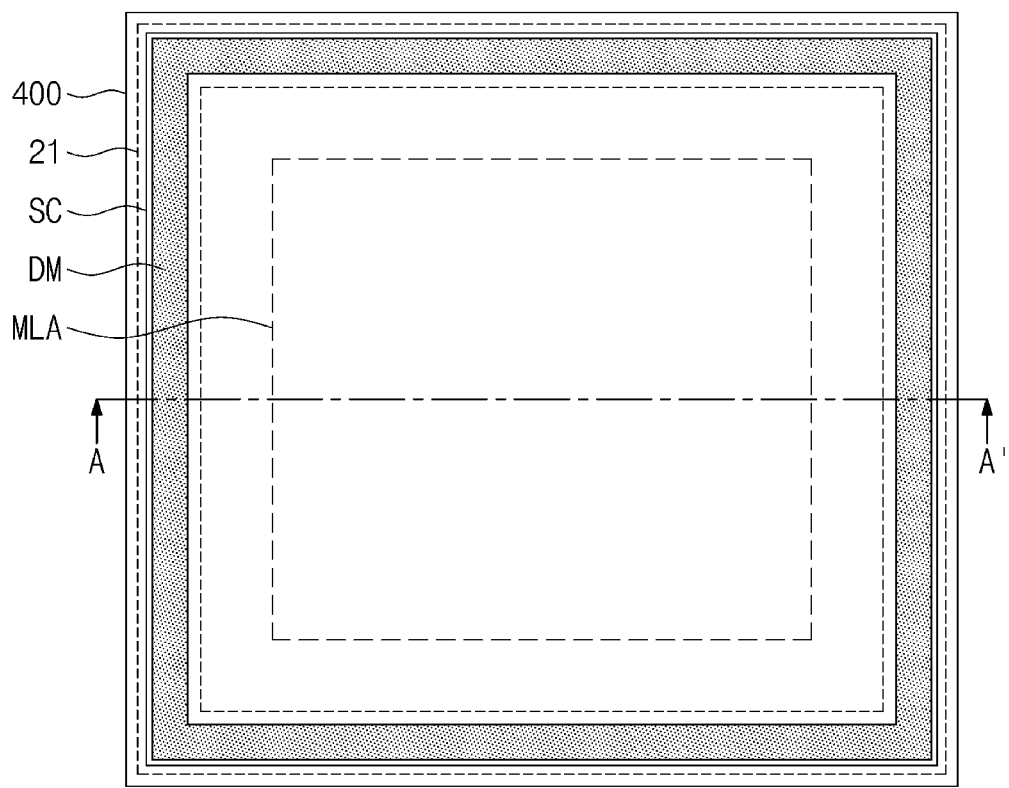
FIG. 1A is a plan view schematically illustrating a semiconductor package according to an embodiment of the inventive concept.
Figure 1B:
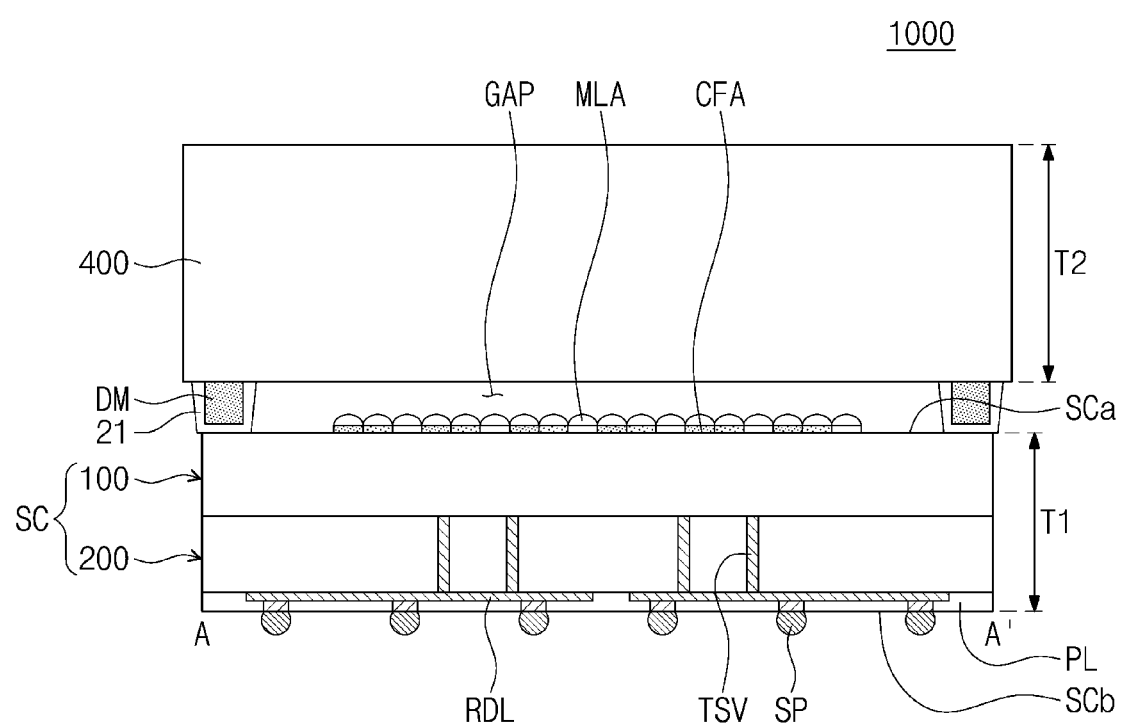
FIG. 1B is a sectional view, which is taken along a line A-A' of FIG. 1A to schematically illustrate a semiconductor package according to an embodiment of the inventive concept.

FIG. 1A is a plan view schematically illustrating a semiconductor package according to an embodiment of the inventive concept. FIG. 1B is a sectional view, which is taken along a line A-A' of FIG. 1A to schematically illustrate a semiconductor package according to an embodiment of the inventive concept.

Referring to FIGS. 1A and 1B, a semiconductor package 1000 in the present embodiment may include a semiconductor chip structure SC and a transparent substrate 400 disposed on the semiconductor chip structure SC. The semiconductor chip structure SC may include a first surface SCa and a second surface SCb, which are opposite to each other. The transparent substrate 400 may be disposed adjacent to the first surface SCa. For example, the first surface SCa of the semiconductor chip structure SC may face the transparent substrate 400. The transparent substrate 400 may be formed of or include at least one of transparent polymeric materials (e.g., acryl) or glass. On an edge of the semiconductor chip structure SC, a dam DM may be disposed between the semiconductor chip structure SC and the transparent substrate 400. For example, the dam DM may be formed on a periphery/perimeter of the semiconductor chip structure SC and/or the transparent substrate 400 in a plan view as shown in FIG. 1A. The dam DM may include an insulating material. For example, the dam DM may include at least one of dry film resist (DFR), epoxy, or insulating materials. For example, the dam DM may be a barrier or a wall formed between the semiconductor chip structure SC and the transparent substrate 400 so that impurities/foreign matters may not flow into a gap between the semiconductor chip structure SC and the transparent substrate 400. The dam DM may be in contact with the transparent substrate 400. For example, a top surface of the dam DM may directly contact a bottom surface of the transparent substrate 400. The dam DM may be spaced apart from the semiconductor chip structure SC. For example, a bottom surface of the dam DM may be above a top surface of the semiconductor chip structure SC and spaced apart from the top surface of the semiconductor chip structure SC in the vertical direction. The dam DM may be disposed along the edge of the semiconductor chip structure SC, e.g., in a plan view, and may have a closed-loop shape, e.g., in the plan view. Due to the presence of the dam DM, an empty space GAP may be provided between the transparent substrate 400 and the semiconductor chip structure SC. It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present.

An adhesive layer 21 may be interposed between the dam DM and the semiconductor chip structure SC. For example, a top surface of a portion of the adhesive layer 21 may contact the bottom surface of the dam DM, and a bottom surface of a portion of the adhesive layer 21 may contact a top surface of the semiconductor chip structure SC. The adhesive layer 21 may separate or hermetically seal the empty space GAP from the outside. Accordingly, a contamination material or external moisture may be prevented from entering the empty space GAP. The adhesive layer 21 may be extended to cover a sidewall of the dam DM and to be in contact with the transparent substrate 400. The adhesive layer 21 may include epoxy. A portion of the adhesive layer 21 in contact with the transparent substrate 400 may be thicker than another portion of the adhesive layer 21 between the dam DM and the semiconductor chip structure SC. The thickness of the adhesive layer 21 may increase with decreasing distance from the transparent substrate 400. This structure may increase an adhesive strength between the transparent substrate 400 and the semiconductor chip structure SC, compared with the structure, in which the adhesive layer 21 is only disposed between the dam DM and the semiconductor chip structure SC. Although not shown, a portion of the adhesive layer 21 may be extended to cover a sidewall of the semiconductor chip structure SC. For example, a thickness of the adhesive layer 21 formed on the side wall of the dam DM may be thicker than a thickness of the adhesive layer 21 formed between the dam DM and the semiconductor chip structure SC. For example, the thickness of the adhesive layer 21 formed on the side wall of the dam DM may be measured in a direction perpendicular to the extending direction to the dam DM and parallel to the first surface SCa of the semiconductor chip structure SC, and the thickness of the adhesive layer 21 formed between the dam DM and the semiconductor chip structure SC may be measured in a direction perpendicular to the first surface SCa of the semiconductor chip structure SC.

A width of the semiconductor chip structure SC may be less than a width of the transparent substrate 400. The semiconductor chip structure SC may have a first thickness T1, and the transparent substrate 400 may have a second thickness T2. The first thickness T1 may be less than the second thickness T2. In an embodiment, the first thickness T1 may range from about 10 μm-100 μ82 m, and the second thickness T2 may range from about 200 μm-300 μm.

The sidewall of the semiconductor chip structure SC may not be covered with a mold layer and may be exposed, e.g., to the air or a gas. Accordingly, this may be beneficial to reduce the volume of the semiconductor package 1000 compared to a device covered with a mold layer, and may provide a technical advantage of higher integration density.

For example, the sidewall of the semiconductor chip structure SC may be exposed to the air in case of a single supply of the semiconductor package 1000 or when the semiconductor package 1000 is mounted on a substrate or on another device. If the mold layer is provided and a crack occurs in the mold layer, the crack may propagate to the semiconductor chip structure SC. In addition, due to a difference in physical characteristics (e.g., thermal expansion coefficient) between the mold layer and the semiconductor chip structure SC, the crack may occur in the semiconductor chip structure SC. However, according to an embodiment of the inventive concept, since the sidewall of the semiconductor chip structure SC is not covered with the mold layer, these issues may be prevented.

Figure 2:
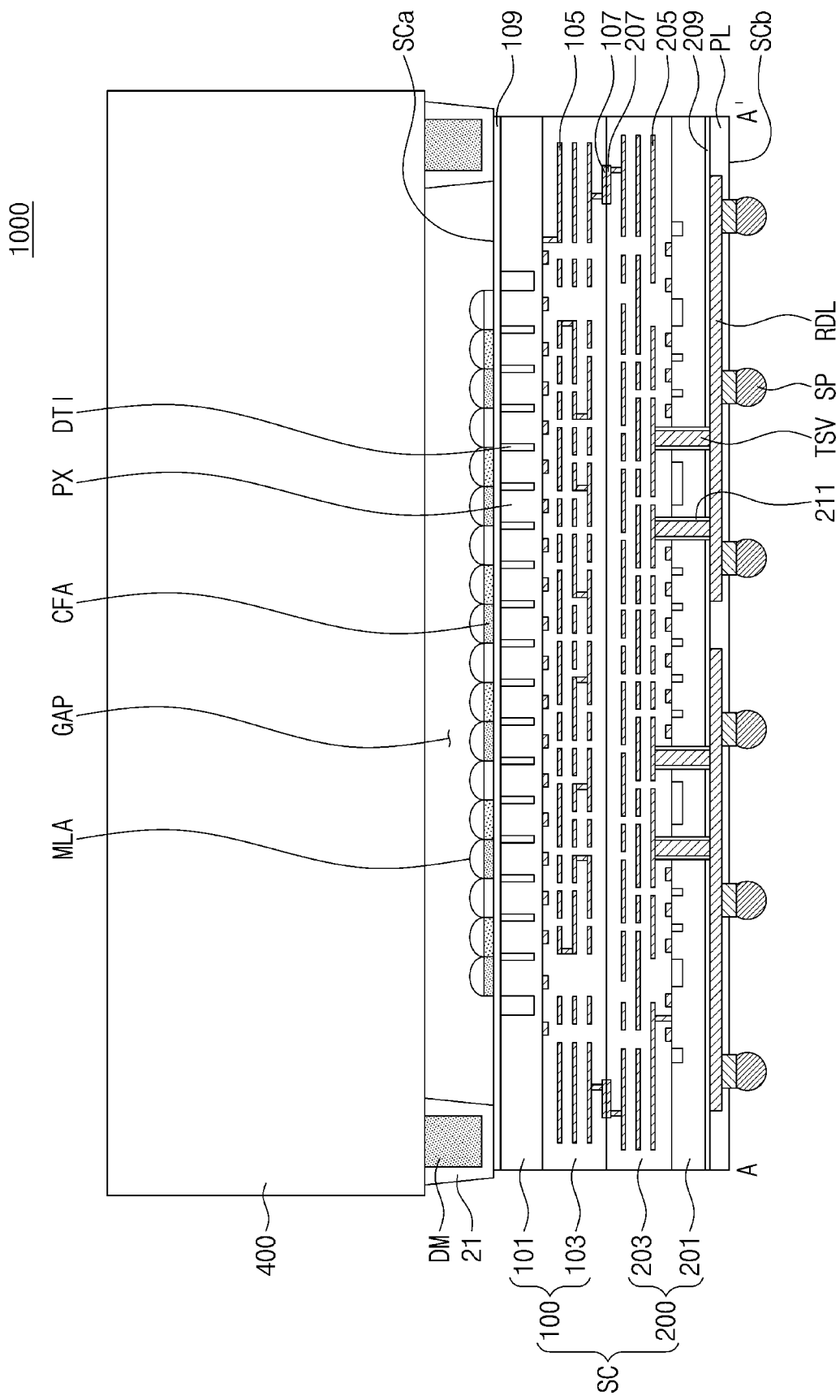
FIG. 2 is a sectional view illustrating a detailed structure of the semiconductor package of FIG. 1B.

The semiconductor chip structure SC may include an image sensor chip 100 adjacent to the first surface SCa and a logic chip 200 adjacent to the second surface SCb. The image sensor chip 100 may be in contact with the logic chip 200. A top surface of the image sensor chip 100 may correspond to the first surface SCa. A bottom surface of the logic chip 200 may correspond to the second surface SCb. A sidewall of the image sensor chip 100 may be aligned with a sidewall of the logic chip 200, e.g., in the thickness direction of the image sensor chip 100 and the logic chip 200 as shown in FIGS. 1B and 2. A micro lens array MLA may be disposed on the image sensor chip 100 to be adjacent to the transparent substrate 400. For example, the micro lens array MLA may be disposed on the top surface of the image sensor chip 100. The micro lens array MLA may include a plurality of semi-spherical micro lenses.

A color filter array CFA may be disposed below the micro lens array MLA. For example, the color filter array CFA may be disposed between the top surface of the image sensor chip 100 and the micro lens array MLA. The color filter array CFA may include a plurality of color filters. For example, the color filter array CFA may include a plurality of red color filter patterns, a plurality of green color filter patterns and/or a plurality of blue color filter patterns. In an embodiment, the color filter array CFA may have a Bayer structure, in which a red color filter, a blue color filter, and two green color filters are disposed in one unit arrangement, a Tetra structure, in which respective color filters are disposed to form a 2×2 arrangement, or a Nona structure, in which respective color filters are disposed to form a 3×3 arrangement. For example, the number of green color filter patterns in a unit area may be two times the number of red color filter patterns in the unit area and/or may be two times the number of blue color filter patterns in the unit area. In certain embodiments, the number of green color filter patterns in a unit area may be the same as the number of red color filter patterns and/or the number of blue color filter patterns in the unit area.

The logic chip 200 may include a through electrode TSV, which is provided to penetrate at least a portion thereof. For example, the through electrode TSV may penetrate one layer or multiple layers formed in the logic chip 200. In certain embodiments, the through electrode TSV may penetrate the whole thickness of the logic chip 200. The through electrode TSV may be electrically connected to a redistribution pattern RDL. Outer connection terminals SP may be connected to the redistribution pattern RDL. The outer connection terminals SP may include, for example, conductive bumps or solder balls. The redistribution pattern RDL may be covered with a redistribution insulating layer PL. The redistribution insulating layer PL may be formed of or include at least one of silicon nitride, polyimide, or photo solder resist (PSR).

In the semiconductor package 1000 according to an embodiment of the inventive concept, a conductive pad for a wire bonding pad may not be provided on the first surface SCa of the semiconductor chip structure SC. Since the through electrode TSV and the outer connection terminal SP, instead of the conductive pad, are used for connection with an external device in a flip-chip bonding manner, signal transfer speed of the semiconductor package 1000 may be improved. Since there is no need for an additional space for the wire bonding and the transparent substrate 400 may be directly attached to the semiconductor chip structure SC, the current embodiment may be advantageous to reduce the overall size of the semiconductor package 1000.

FIG. 2 is a sectional view illustrating a detailed structure of the semiconductor package of FIG. 1B.

Referring to FIG. 2, the image sensor chip 100 may include a first substrate 101 and a first interlayered insulating layer 103. The first substrate 101 may be, for example, a single-crystalline silicon substrate or a semiconductor layer, such as an epitaxial silicon layer. The first interlayered insulating layer 103 may be formed of or include at least one of silicon nitride, silicon oxide, silicon oxynitride, or porous insulating layers and may have a single- or multi-layered structure. A deep device isolation layer DTI may be disposed in the first substrate 101 to delimit a plurality of pixel regions PX, which are spaced apart from each other, e.g., by the deep device isolation layer DTI. Although not shown, the deep device isolation layer DTI may have a lattice shape in a plan view. The deep device isolation layer DTI may include at least one of a silicon oxide layer and a fixed charge layer. For example, the deep device isolation layer DTI may include elements generating positive fixed charge or negative fixed charge. The deep device isolation layer DTI may further include a polysilicon pattern, which is spaced apart from the first substrate 101, e.g., an insulator layer may be interposed between the polysilicon pattern and the first substrate 101. The deep device isolation layer DTI may further include an air gap region. Although not shown, photoelectric conversion regions may be formed in the first substrate 101 and in the pixel regions PX, which are spaced apart from each other by the deep device isolation layer DTI. The photoelectric conversion regions may be doped to have a different conductivity type from that of the first substrate 101.

A top surface of the first substrate 101 may be covered with a first protection layer 109. The protection layer 109 may serve as an anti-reflection layer. The first protection layer 109 may be formed of or include, for example, silicon nitride. Although not shown, a fixed charge layer may be interposed between the protection layer 109 and the first substrate 101. The fixed charge layer may include elements generating positive fixed charge or negative fixed charge. The fixed charge layer may include at least one of metal oxides, such as aluminum oxide, tantalum oxide, and hafnium oxide. The color filter array CFA may be disposed on the protection layer 109. The micro lens array MLA may be disposed on the color filter array CFA.

Gate electrodes, contact plugs, via plugs, and first interconnection lines 105 may be disposed in the first interlayered insulating layer 103. First conductive pads 107, which are electrically connected to the first interconnection lines 105, may be disposed in the first interlayered insulating layer 103. The first conductive pad 107 may include a metallic material, such as copper, aluminum, and tungsten. A bottom surface of the first conductive pad 107 may be coplanar with a bottom surface of the first interlayered insulating layer 103.

The logic chip 200 may include circuits, which are configured to drive the image sensor chip 100. The logic chip 200 may include a second substrate 201 and a second interlayered insulating layer 203. The second substrate 201 may be, for example, a single-crystalline silicon substrate or a semiconductor layer, such as an epitaxial silicon layer. A shallow device isolation layer may be disposed in the second substrate 201 to delimit active regions. The second interlayered insulating layer 203 may be, for example, a single-crystalline silicon substrate or a semiconductor layer, such as an epitaxial silicon layer. Each of the first and second interlayered insulating layers 103 and 203 may be formed of or include at least one of silicon nitride, silicon oxide, silicon oxynitride, or porous insulating layers and may have a single- or multi-layered structure. Gate electrodes, contact plugs, via plugs, and second interconnection lines 205 may be disposed in the second interlayered insulating layer 203.

Second conductive pads 207, which are electrically connected to the second interconnection lines 205, may be disposed in the second interlayered insulating layer 203. The second conductive pad 207 may include a metallic material, such as copper, aluminum, and tungsten. A top surface of the second conductive pad 207 may be coplanar with a top surface of the second interlayered insulating layer 203. The first interlayered insulating layer 103 may be in contact with the second interlayered insulating layer 203. The first conductive pad 107 may be in contact with the second conductive pad 207. Alternatively, any interfacial boundary may not be formed between the first conductive pad 107 and the second conductive pad 207, and in this case, the first conductive pad 107 and the second conductive pad 207 may constitute a conductive pattern, which is provided in the form of a single object.

The through electrode TSV may be provided to penetrate the second substrate 201 and at least a portion of the second interlayered insulating layer 203, and the through electrode TSV may be electrically connected to at least one of the second interconnection lines 205. The through electrode TSV may include a metallic material, such as copper, aluminum, and tungsten. A via insulating layer 211 may be interposed between the through electrode TSV and the second substrate 201. A bottom surface of the second substrate 201 may be covered with a second protection layer 209. The second protection layer 209 may be formed of or include, for example, silicon nitride. The redistribution pattern RDL may be disposed on the second protection layer 209. The redistribution pattern RDL may include a metallic material, such as copper, aluminum, and tungsten. In some embodiments, the through electrode TSV may extend upward to wholly penetrate the second interlayered insulating layer 203. In certain embodiments, the through electrode TSV may extend into the first interlayered insulating layer 103.

The through electrode TSV may not extend into the first substrate 101 of the image sensor chip 100. For example, when the pixel regions PX are disposed in a center region of the first substrate 101, the through electrode TSV may not be formed in the center region of the first substrate 101. However, the inventive concept is not limited to this feature. According to an embodiment of the inventive concept, since the through electrode TSV is disposed in the logic chip 200, the through electrode TSV may be disposed at an arbitrary position, regardless of positions of the pixel regions PX. Accordingly, degree of freedom in providing an interconnection structure may increase. For example, the semiconductor chip structure SC may include a plurality of through electrodes TSV, and some or all of the through electrodes TSV may be disposed in positions overlapping the pixel regions PX in a plan view.

In the present embodiment, a top surface of the first protection layer 109 may correspond to the first surface SCa of the semiconductor chip structure SC, and a bottom surface of the redistribution insulating layer PL may correspond to the second surface SCb of the semiconductor chip structure SC. The adhesive layer 21 may be in contact with the first protection layer 109.

Figure 3A:
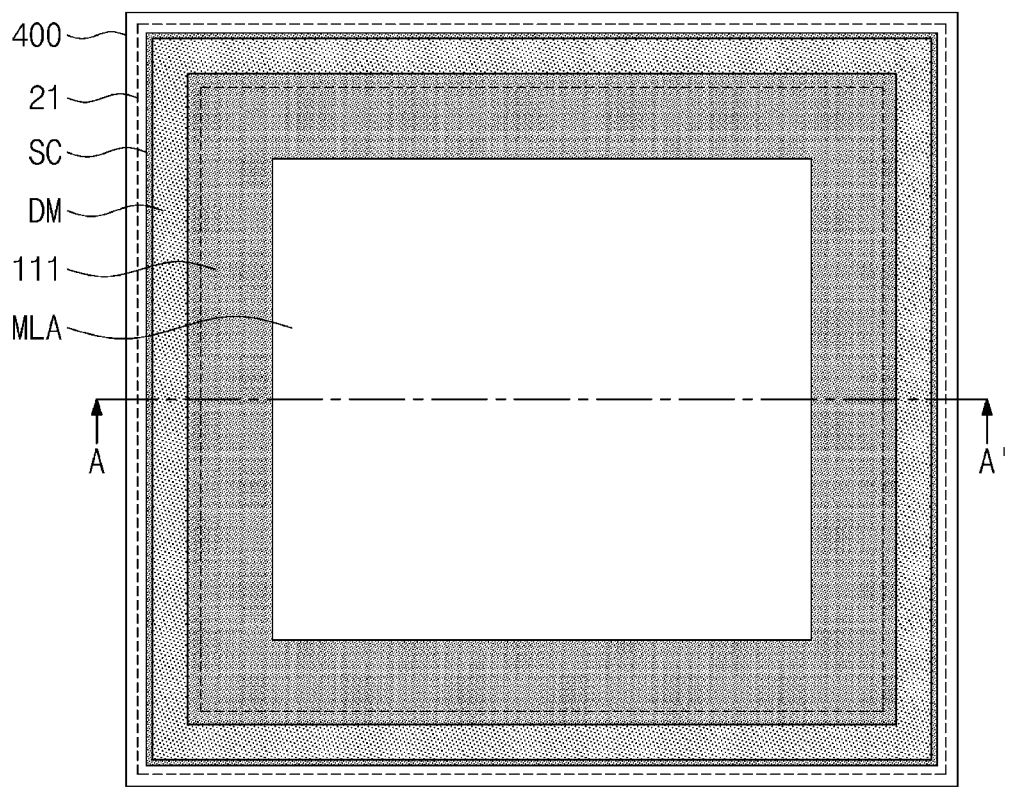
FIG. 3A is a schematic plan view illustrating a semiconductor package according to an embodiment of the inventive concept.
Figure 3B:
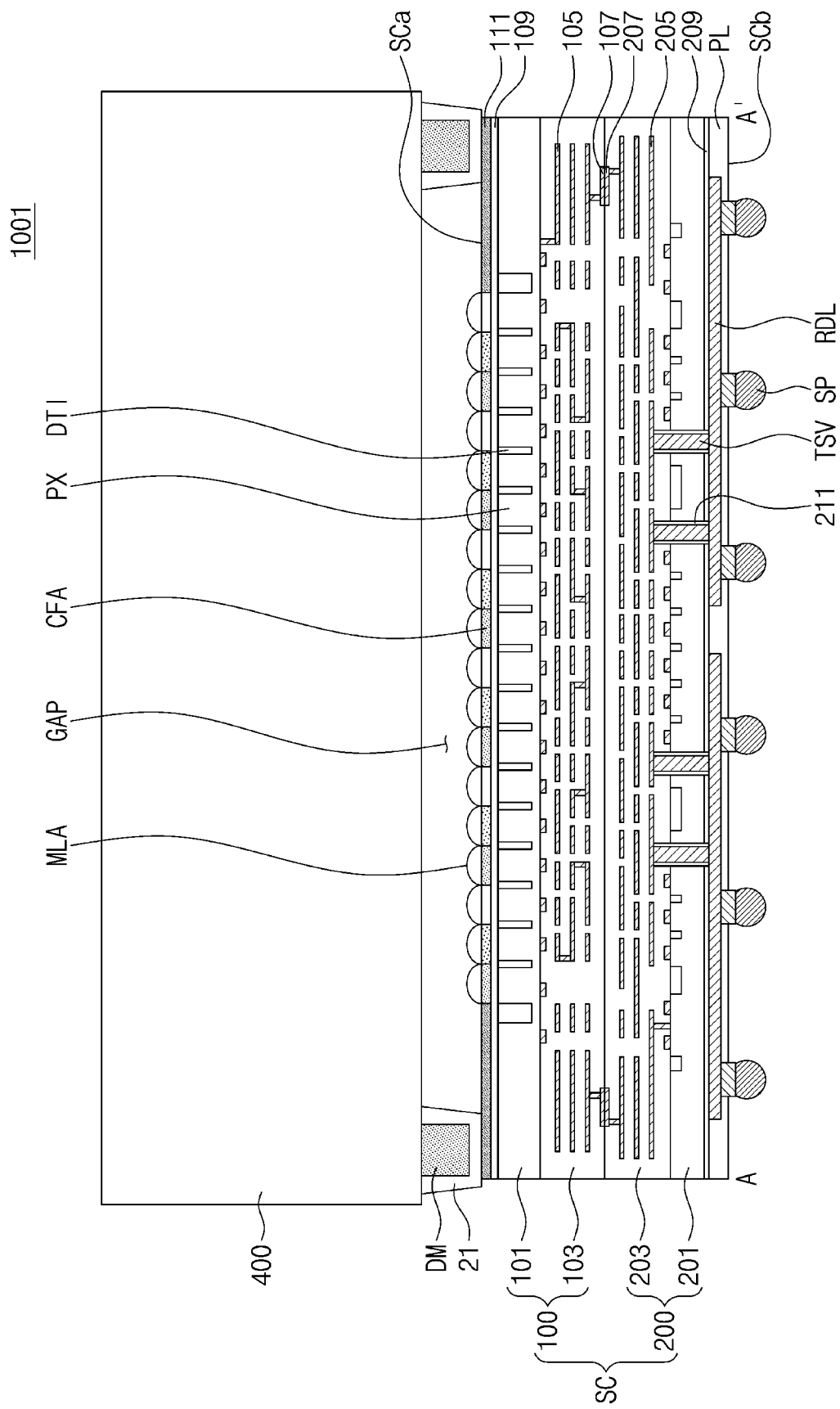
FIG. 3B is a sectional view, which is taken along a line A-A' of FIG. 3A to schematically illustrate a semiconductor package according to an embodiment of the inventive concept.

FIG. 3A is a schematic plan view illustrating a semiconductor package according to an embodiment of the inventive concept. FIG. 3B is a sectional view, which is taken along a line A-A' of FIG. 3A to schematically illustrate a semiconductor package according to an embodiment of the inventive concept.

Referring to FIGS. 3A and 3B, in a semiconductor package 1001 according to an embodiment of the inventive concept, light-shielding patterns 111 may be provided along an edge of the image sensor chip 100 and adjacent to the transparent substrate 400. In a plan view, the light-shielding patterns 111 may be disposed along an edge of the semiconductor chip structure SC to enclose the micro lens array MLA and/or the color filter array CFA. The light-shielding patterns 111 may be disposed on the first protection layer 109. The light-shielding patterns 111 may be positioned at the same height as the color filter array CFA. Herein, the term "height" may refer to a distance from a planar surface of the image sensor chip 100 in a perpendicular direction. The light-shielding patterns 111 may include the same material as color filters constituting the color filter array CFA. For example, the color filter array CFA may comprise different color filters corresponding to different wavelengths, and the light-shielding patterns 111 may be formed of a stack of the different color filters. In certain embodiments, the light-shielding patterns 111 may be formed of a mixture of materials comprising the different color filters. The light-shielding patterns 111 may include a photosensitive material, in which a black pigment is contained. The light-shielding patterns 111 may be formed by a photolithography process. The light-shielding patterns 111 may block light from being incident into the color filter array CFA through a sidewall of the image sensor chip 100 and may prevent an edge portion of an image from being distorted. This may allow the image sensor chip 100 to obtain a clear image. Except for the afore-described features, the semiconductor package 1001 may have the same or substantially the same features as that described with reference to FIGS. 1A, 1B, and 2.

FIGS. 4A to 4F are sectional views sequentially illustrating a process of fabricating a semiconductor chip, according to an embodiment of the inventive concept.

Referring to FIGS. 4A and 2, a first wafer W1 may be attached to a top surface of a carrier substrate CS by a wafer-support system (WSS) process. For example, an adhesive element 11 may be interposed between the carrier substrate CS and the first wafer W1. The adhesive element 11 may have a structure, in which adhesive and release layers are alternately stacked. One of the adhesive and release layers may include a material that can be decomposed by heat or ultraviolet light. A content of cross-linking agent in the release layer may be lower than the adhesive layer. For example, the release layers may have a smaller adhesive strength than the adhesive layers. For example, the release layers may have a lower surface energy than the adhesive layers, the first wafer W1 and the carrier substrate CS.

The first wafer W1 may include first scribe lane portions SR1 and image sensor chip portions IR. The image sensor chip portions IR may have the same structure as the image sensor chip 100 described with reference to FIG. 3B. The micro lens array MLA and the color filter array CFA may be disposed in the image sensor chip portions IR. The micro lens array MLA may be in contact with the adhesive element 11 and may be inserted into the adhesive element 11. For example, the adhesive element 11 may contact the micro lenses of the micro lens array MLA in the area where the micro lens array MLA is formed, and may contact the other portions of the surface facing the carrier substrate CS.

A second wafer W2 may include second scribe lane portions SR2 and logic chip portions LR. The logic chip portions LR may include the second interlayered insulating layer 203, the second substrate 201, or the like, except for the through electrode TSV, the via insulating layer 211, the second protection layer 209, the redistribution pattern RDL, the redistribution insulating layer PL, and the outer connection terminal SP in the logic chip 200 of FIG. 3B. The second wafer W2 may have a third thickness T3.

A thermo-compression process may be performed to bond the first wafer W1 to the second wafer W2. Here, the second wafer W2 may be placed, such that the second scribe lane portions SR2 of the second wafer W2 overlap the first scribe lane portions SR1 of the first wafer W1. The second interlayered insulating layer 203 in the second wafer W2 may be placed to be in contact with the first interlayered insulating layer 103 in the first wafer W1. In addition, the second conductive pad 207 in the second wafer W2 may be in contact with the first conductive pad 107 in the first wafer W1. The first wafer W1 and the second wafer W2 may constitute a device substrate or a device wafer DW.

Referring to FIGS. 4B and 2, a grinding process may be performed to reduce a thickness of the second wafer W2 to a fourth thickness T4. For example, the grinding process may be performed to remove a portion of the second substrate 201 in the second wafer W2. The second protection layer 209 may be formed on the second substrate 201, e.g., after performing the grinding process. The grinding process may be performed, such that the device wafer DW has a thickness similar to the first thickness T1 of FIG. 1B.

Figure 4C:
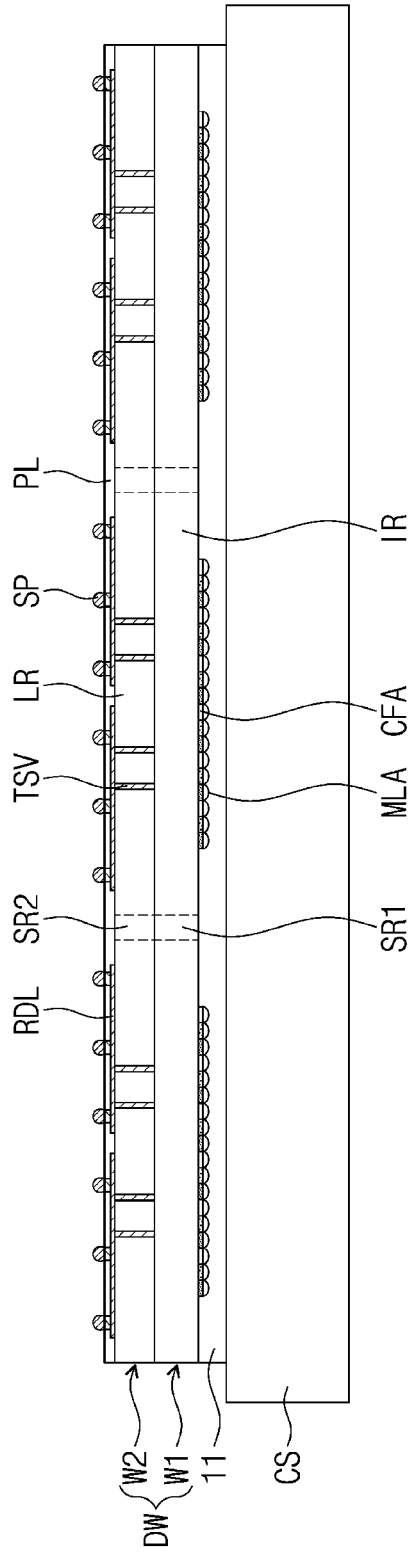

Referring to FIGS. 4C and 2, the second protection layer 209, the second substrate 201, and a portion of the second interlayered insulating layer 203 of the second wafer W2 may be etched to form a penetration hole, and then, the via insulating layer 211 may be formed to cover a sidewall of the penetration hole. For example, the penetration hole may pass through the second substrate 201 and may enter into the second interlayered insulating layer 203. The via insulating layer 211 may be formed through deposition and etching processes. The via insulating layer 211 may include a silicon oxide layer or a silicon nitride layer. Next, a conductive layer may be formed to fill the penetration hole, and then, a chemical-mechanical polishing (CMP) process may be performed to form the through electrode TSV. A conductive layer may be stacked on the second protection layer 209 and may be patterned to form the redistribution pattern RDL in contact with the through electrode TSV. Next, the redistribution insulating layer PL may be formed to cover the redistribution pattern RDL and the second protection layer 209. The redistribution insulating layer PL may be formed of or include at least one of silicon nitride, polyimide, or photo solder resist (PSR). The redistribution insulating layer PL may be patterned to form holes exposing portions of the redistribution pattern RDL. Thereafter, the outer connection terminals SP may be formed to be in contact with the redistribution pattern RDL through the holes.

Figure 4D:
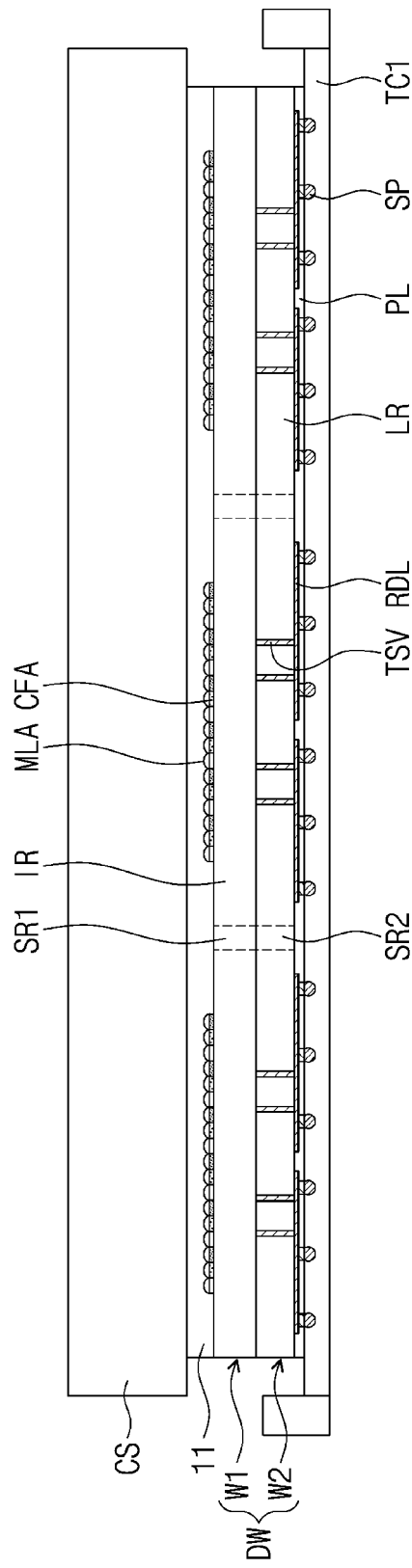

Referring to FIG. 4D, the structure of FIG. 4C may be inverted and may be attached to a first de-bonding tape TC1. Accordingly, the outer connection terminals SP and the redistribution insulating layer PL may be in contact with the first de-bonding tape TC1. The first de-bonding tape TC1 may protect the outer connection terminals SP.

Referring to FIG. 4E, the carrier substrate CS may be separated from the device wafer DW. To do this, a physical force may be applied between the carrier substrate CS and the adhesive element 11. In this step, a portion of the adhesive element 11 may be left on the carrier substrate CS. The adhesive element 11 may be removed from the device wafer DW. The removal of the adhesive element 11 may include irradiating the adhesive element 11 with ultraviolet (UV) light or applying heat to the adhesive element 11 to decompose the adhesive or release layer included in the adhesive element 11. Alternatively, the adhesive element 11 may be removed by a physical force.

Referring to FIG. 4F, a singulation process may be performed to remove the second scribe lane portions SR2 and the first scribe lane portions SR1, and as a result, semiconductor chip structures SC, which are spaced apart from each other, may be formed. Thereafter, although not shown, a test step may be performed on the semiconductor chip structures SC to remove defective products among the semiconductor chip structures SC.

Figure 5A:
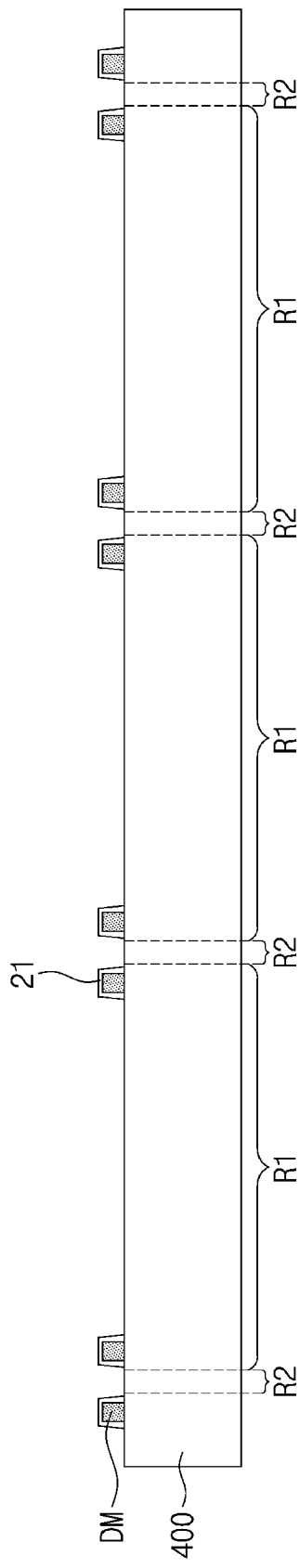
FIGS. 5A to 5C are sectional views sequentially illustrating a process of fabricating a semiconductor package according to an embodiment of the inventive concept.
Figure 5B:
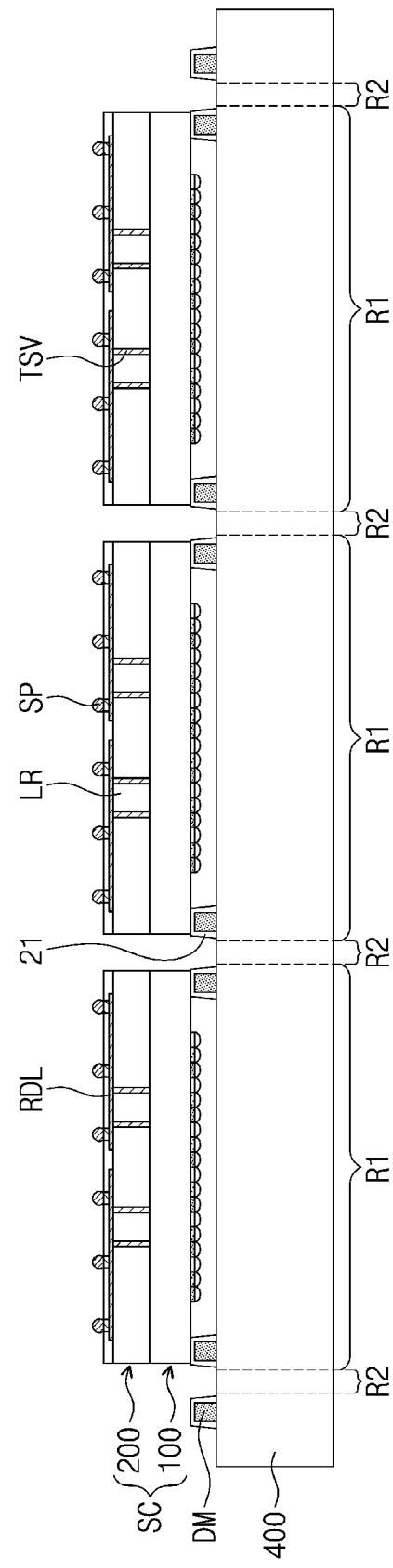
Figure 5C:
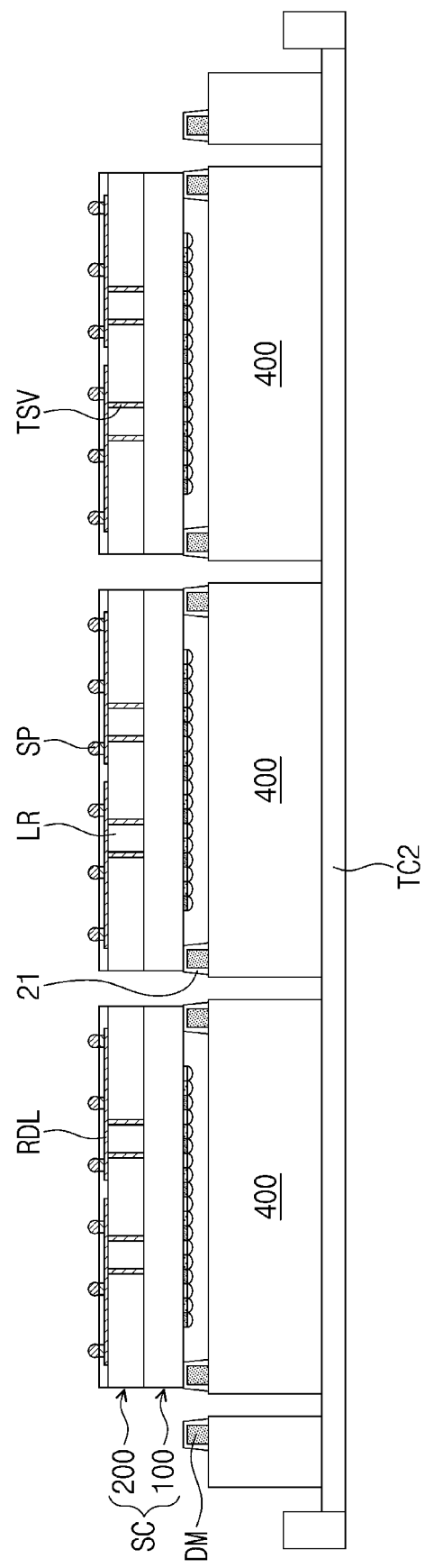

FIGS. 5A to 5C are sectional views sequentially illustrating a process of fabricating a semiconductor package according to an embodiment of the inventive concept.

Referring to FIG. 5A, the transparent substrate 400 may be prepared. The transparent substrate 400 may include chip regions R1 and separation regions R2. The dam DM may be formed on and along an edge of the chip region R1, e.g., in a plan view. In each of the chip region R1, the dam DM may have a closed-loop shape, e.g., in a plan view. In certain embodiments, the dam DM may be aligned with side walls of the transparent substrate 400 and/or may overlap the edge/sidewalls of the semiconductor chip structure SC in a plan view and/or in a vertical direction as shown in FIG. 6B. The dam DM may be formed by stacking a dry film resist (DFR) and performing a photolithography process. Alternatively, the dam DM may be formed by stacking and patterning an insulating layer. In certain embodiments, the dam DM may be formed by a printing method using a nozzle. The dam DM may not be formed on the separation region R2.

An adhesive material may be supplied using a nozzle or the like to form the adhesive layer 21 on the dam DM. The adhesive layer 21 may be formed to cover a top and sidewalls of the dam DM. In addition, the adhesive layer 21 may be in contact with the transparent substrate 400. The adhesive layer 21 may be flown downward due to the gravity, and in this case, the thickness of the adhesive layer 21 may be increased in a direction toward the transparent substrate 400.

Referring to FIGS. 5B and 5C, good semiconductor chips, which are chosen from the semiconductor chip structures SC of FIG. 4F, may be attached to the chip regions R1 of the transparent substrate 400. Next, a sawing process using a blade may be performed to remove the separation region R2 of the transparent substrate 400. Accordingly, the semiconductor package 1000 of FIG. 1B may be formed.

As a size of a semiconductor package is reduced, it may be beneficial to reduce a thickness of the semiconductor chip structure. For example, the device wafer DW of FIG. 4B may have a thickness of about 100 μm or smaller. Accordingly, it may be difficult to handle the device wafer DW, without a wafer support system (WSS) process. However, the WSS process may include complicated steps including alternately stacking adhesive layers and release layers on a carrier substrate and attaching a device wafer thereto, and the carrier substrate may be separated through a complicated process after subsequent processes. Therefore, an overall process may become more complicated when multiple WSS processes are applied in manufacturing a semiconductor package. Thus, the more the WSS processes are applied, the higher the product price/cost rises. By contrast, according to an embodiment of the inventive concept, since the WSS process is performed just one time, the overall process may be simplified. In addition, since failed semiconductor chips are removed and only good semiconductor chips are attached to the transparent substrate 400, loss of a transparent substrate may be reduced and production yield of the semiconductor package may be improved.

Figure 6A:
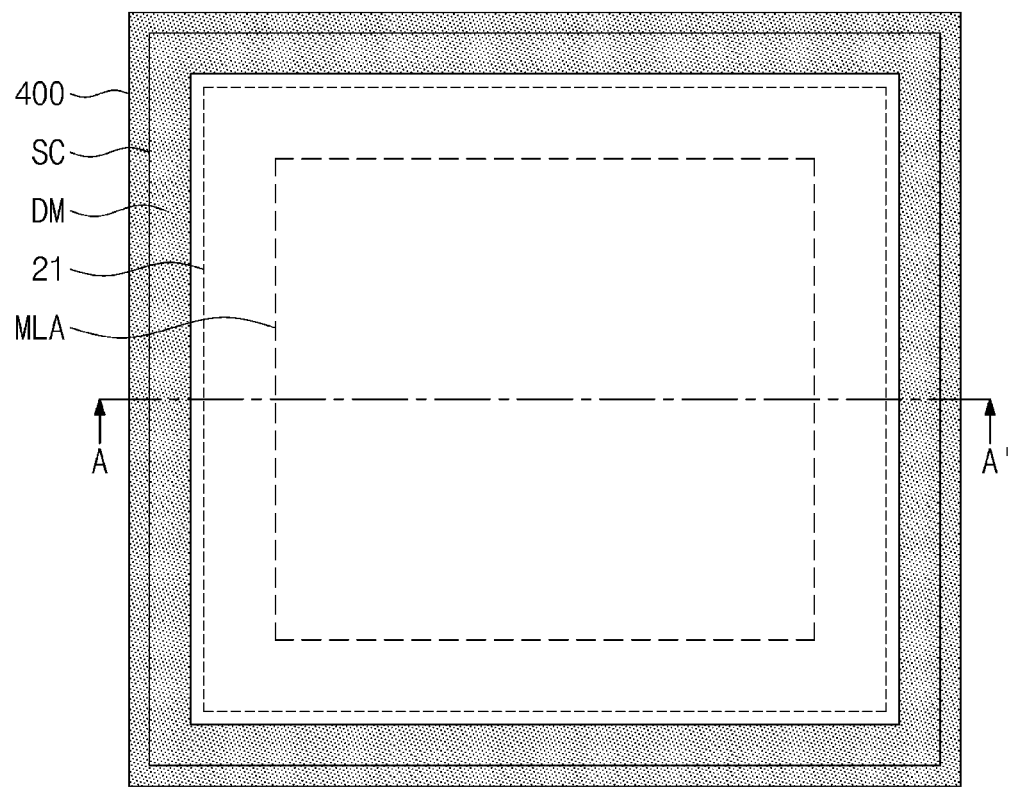
FIG. 6A is a schematic plan view illustrating a semiconductor package according to an embodiment of the inventive concept.
Figure 6B:
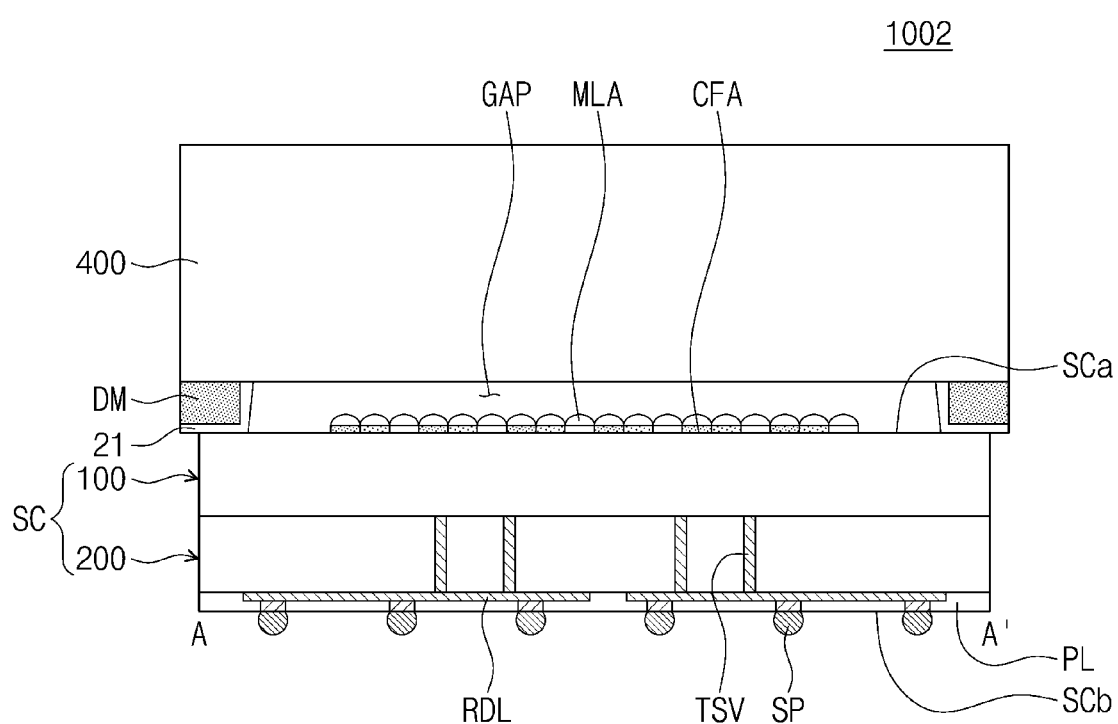
FIG. 6B is a sectional view, which is taken along a line A-A' of FIG. 6A to schematically illustrate a semiconductor package according to an embodiment of the inventive concept.

FIG. 6A is a schematic plan view illustrating a semiconductor package according to an embodiment of the inventive concept. FIG. 6B is a sectional view, which is taken along a line A-A' of FIG. 6A to schematically illustrate a semiconductor package according to an embodiment of the inventive concept.

Referring to FIGS. 6A and 6B, in a semiconductor package 1002 according to the present embodiment, the dam DM may be extended to an edge of the transparent substrate 400. A sidewall of the dam DM may not be covered with the adhesive layer 21 and may be exposed, e.g., to the air or a gas. The dam DM may protrude laterally relative to a sidewall of the semiconductor chip structure SC. For example, the dam DM may protrude outward with respect to sidewalls of the semiconductor chip structure SC in a plan view as shown in FIG. 6A. A sidewall of the dam DM may be aligned with a sidewall of the transparent substrate 400. For example, the outermost sidewalls of the dam DM may be coincident or substantially coincident with sidewalls of the transparent substrate 400 in a plan view as shown in FIG. 6A. The sidewall of the dam DM may be aligned/coincident/substantially coincident with a sidewall of the adhesive layer 21, e.g., in a plan view. However, in an embodiment, a sidewall of the adhesive layer 21 may not be aligned with a sidewall of the semiconductor chip structure SC and may be spaced apart from the sidewall of the semiconductor chip structure SC, e.g., in a plan view. Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "coincident," "parallel," "uniform," "planar," "coplanar," "cylindrical," "square," etc., as used herein when referring to orientation, layout, location, shapes, sizes, amounts, or other measures, encompass acceptable variations from exact identicality, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

Except for the afore-described features, the semiconductor package 1002 may have the same or substantially the same features as that described with reference to FIGS. 1A, 1B, 2, 3A, and 3B.

Figure 7A:
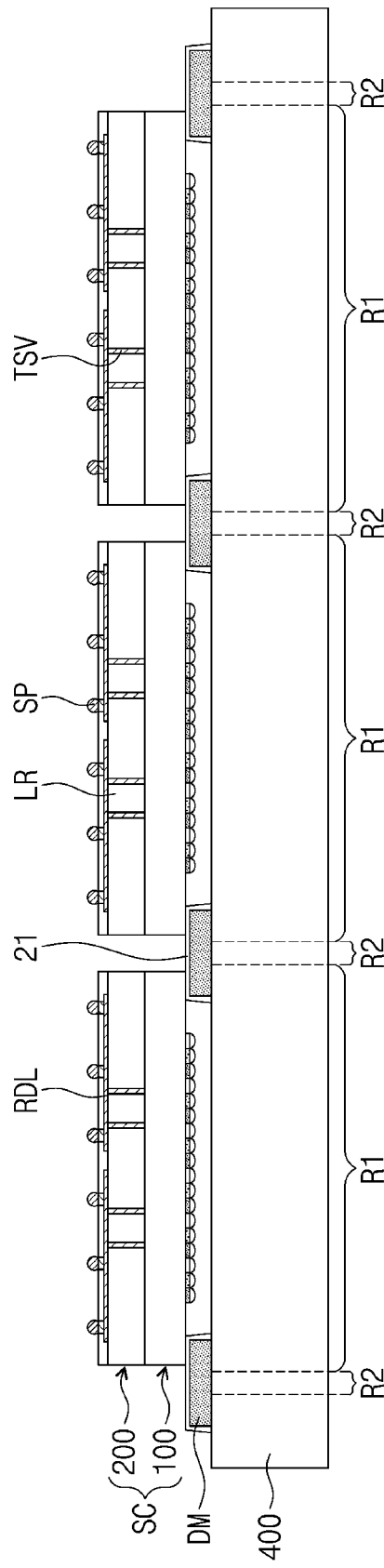
FIGS. 7A and 7B are sectional views sequentially illustrating a process of fabricating the semiconductor package of FIG. 6B.
Figure 7B:
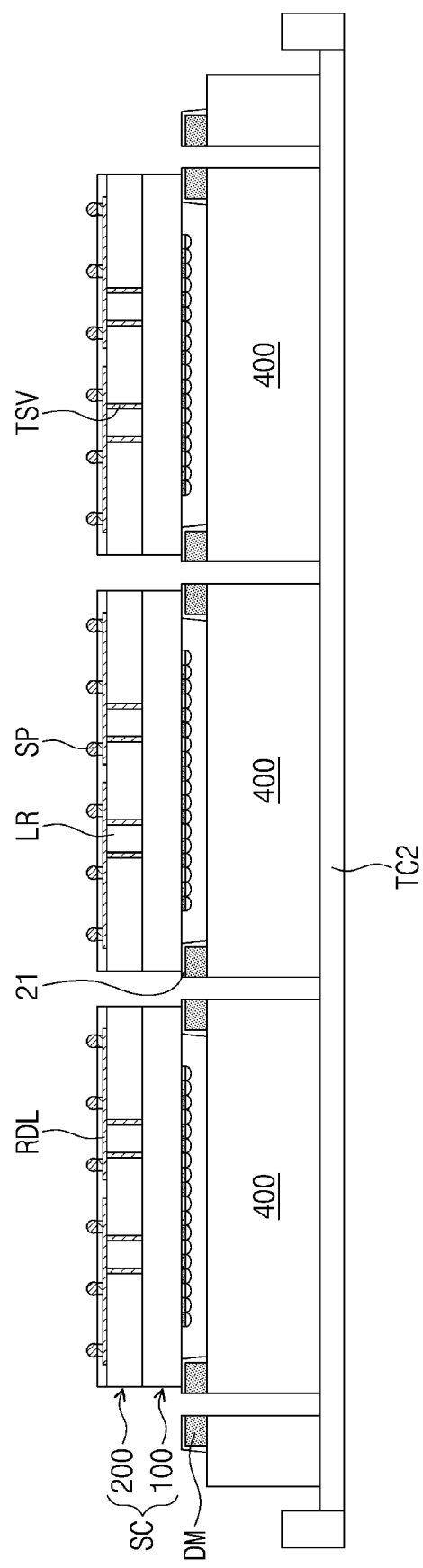

FIGS. 7A and 7B are sectional views sequentially illustrating a process of fabricating the semiconductor package of FIG. 6B.

Referring to FIGS. 7A and 7B, differently from the formation of the dam DM of FIG. 5A, the dam DM may be formed to cover not only the edges of adjacent chip regions R1 but also the separation region R2 placed therebetween. For example, the dam DM may be formed to cover the edge of a first chip region R1, extend across the entire width of the separation region R2, and cover the edge of a second (adjacent) chip region R1. For example, a width of the dam DM in FIG. 7A may be larger than that in FIG. 5A. Next, the adhesive layer 21 may be formed on the dam DM. The semiconductor chip structures SC may be attached to the adhesive layer 21, and then, a sawing process may be performed. The sawing process may be performed to cut not only the transparent substrate 400 but also the dam DM and the adhesive layer 21. Except for the afore-described features, the fabrication process may be performed in the same or similar manner as that described with reference to FIGS. 4A to 4F and FIGS. 5A to 5C.

Figure 8:
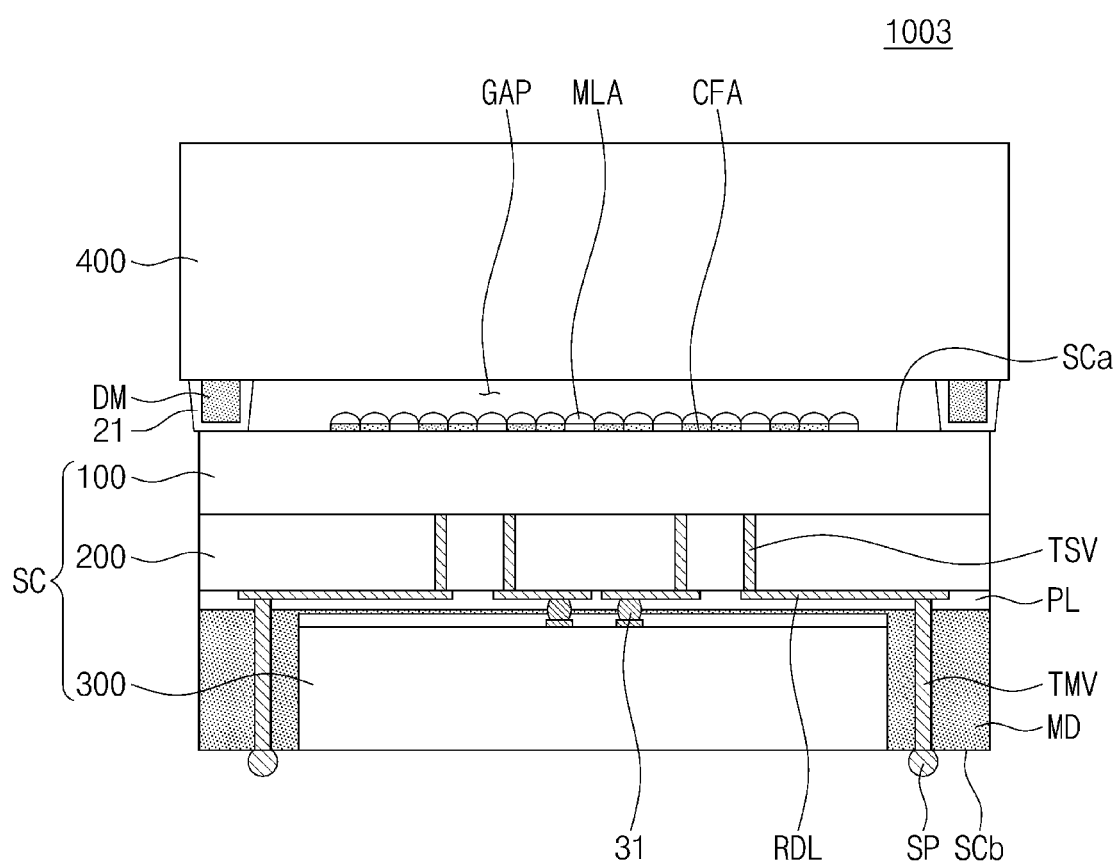
FIG. 8 is a sectional view illustrating a semiconductor package according to an embodiment of the inventive concept.

FIG. 8 is a sectional view illustrating a semiconductor package according to an embodiment of the inventive concept.

Referring to FIG. 8, in a semiconductor package 1003 according to the present embodiment, the semiconductor chip structure SC may include the image sensor chip 100, a logic chip 200, and a memory chip 300. The logic chip 200 may be interposed between the image sensor chip 100 and the memory chip 300. The memory chip 300 may be electrically connected to the redistribution pattern RDL of the logic chip 200 through an internal connection terminal 31. A sidewall of the memory chip 300 may be covered with a mold layer MD. The mold layer MD may include epoxy mold compound (EMC). The mold layer MD may be in contact with the redistribution insulating layer PL. A sidewall of the mold layer MD may be aligned/coincident/substantially coincident with a sidewall of the logic chip 200, e.g., in a plan view. A portion of the mold layer MD may be interposed between the memory chip 300 and the logic chip 200. A bottom surface of the mold layer MD may be coplanar with a bottom surface of the memory chip 300. A through mold via TMV may be provided to pass through the mold layer MD and the redistribution insulating layer PL and may be in contact with the redistribution pattern RDL. The through mold via TMV may be in contact with the mold layer MD. The outer connection terminal SP may be attached to a bottom of the through mold via TMV.

Although not shown, additional redistribution patterns may be formed on the bottom surfaces of the mold layer MD and the memory chip 300, and the outer connection terminal SP may be bonded to the additional redistribution patterns. In such an example, the second surface SCb of the semiconductor chip structure SC may correspond to a bottom surface of the mold layer MD or a bottom surface of the memory chip 300.

The memory chip 300 may be, for example, a DRAM chip. The memory chip 300 may store data, which are generated in the image sensor chip 100 and the logic chip 200 or will be transferred to the image sensor chip 100 and the logic chip 200. Except for the afore-described features, the semiconductor package 1003 may have the same or substantially the same features as that described with reference to FIGS. 1A, 1B, 2, 3A, and 3B.

In the semiconductor package 1003 according to the present embodiment, since the memory chip 300 is electrically connected to the logic chip 200 through the redistribution pattern RDL and the internal connection terminal 31, it may be beneficial to reduce a signal transfer distance, compared to the case that a package substrate, an interposer, or the like is interposed therebetween. Accordingly, it may be beneficial to improve a signal transfer speed and to realize a fast reading function.

If the memory chip 300 is a DRAM chip, technical requirement (e.g., positions) for input/output terminals may be standardized to realize mass production and low cost. In this case, the logic chip 200 and the memory chip 300 may differ from each other in their sizes and positions of the input/output terminals. According to an embodiment of the inventive concept, since the logic chip 200 includes the redistribution pattern RDL, it may be beneficial to increase a degree of freedom in providing an interconnection structure for the connection between the logic chip 200 and the memory chip 300.

Figure 9C:
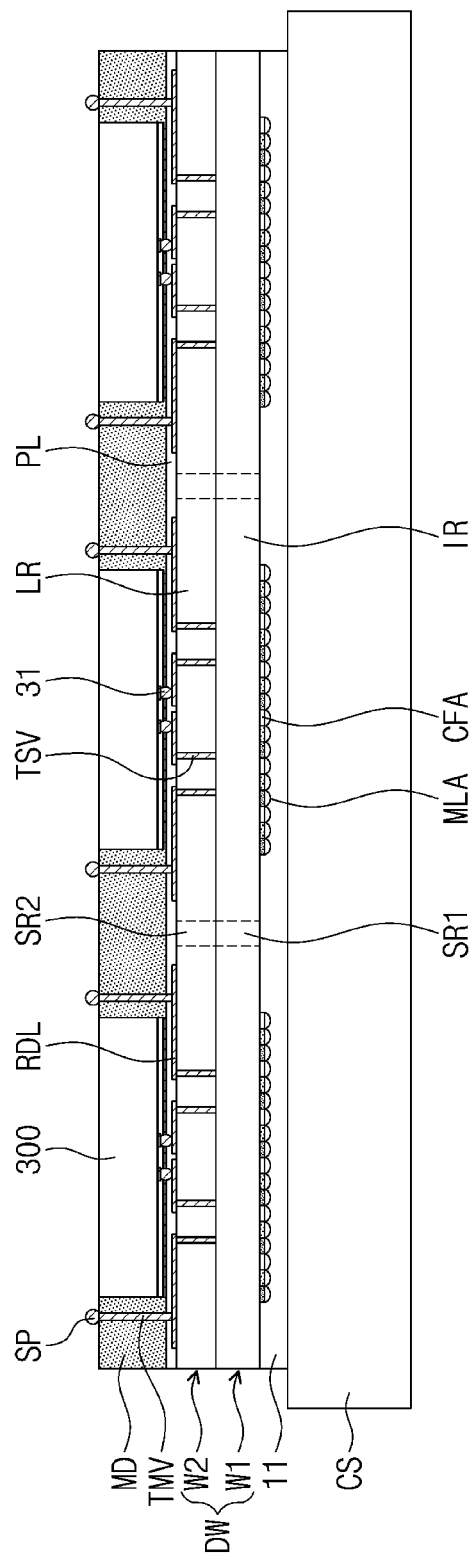

FIGS. 9A to 9C are sectional views sequentially illustrating a process of fabricating the semiconductor package of FIG. 8.

Referring to FIG. 9A, the memory chips 300 may be mounted on the second wafer W2, in a flip-chip bonding manner, using the internal connection terminals 31, before forming outer connection terminals SP similar to the ones shown in the structure of FIG. 4C. The memory chips 300 may be mounted on the logic chip portions LR, respectively.

Referring to FIGS. 9B and 9C, the mold layer MD may be formed to fill a space between the memory chips 300. The mold layer MD and the redistribution insulating layer PL may be etched to form a mold hole exposing the redistribution pattern RDL, and the through mold via TMV may be formed by filling the mold hole with a conductive material. The outer connection terminals SP may be bonded to a top surface of the through mold via TMV. Thereafter, a singulation process may be performed to remove the first and second scribe lane portions SR1 and SR2 and the mold layer MD, which overlaps the first and second scribe lane portions SR1 and SR2, e.g., in a vertical direction, and as a result, the semiconductor chip structures SC, which are spaced apart from each other, may be formed as shown in FIG. 8. Subsequent steps may be performed in the same manner as that described with reference to FIGS. 5A to 5C.

Figure 10:
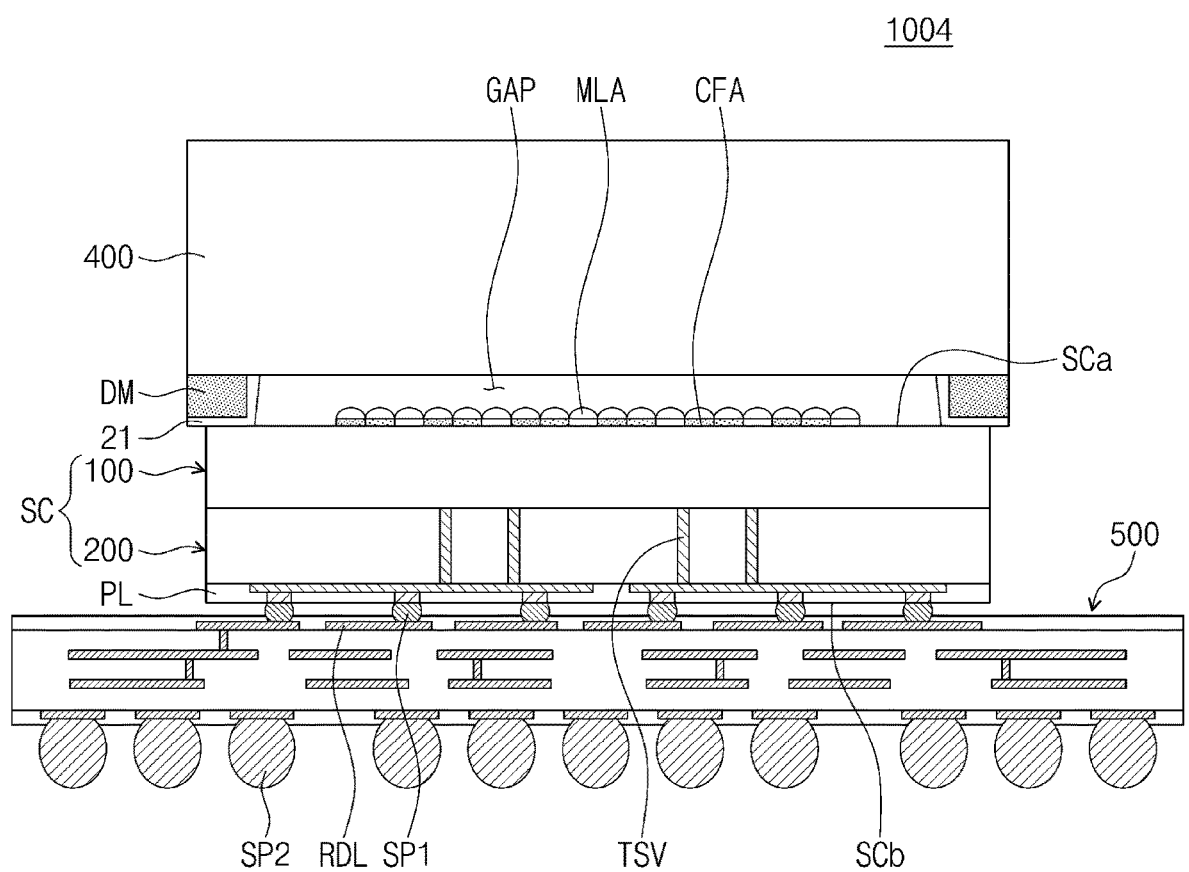
FIG. 10 is a sectional view illustrating a semiconductor package according to an embodiment of the inventive concept.

FIG. 10 is a sectional view illustrating a semiconductor package according to an embodiment of the inventive concept.

Referring to FIG. 10, a semiconductor package 1004 according to the present embodiment may include a package substrate 500. The package substrate 500 may be a printed circuit board of a single- or multi-layered structure. The semiconductor package 1002 of FIG. 6B may be mounted on the package substrate 500, in a flip-chip bonding manner, using a first outer connection terminal SP1. A second outer connection terminal SP2 may be bonded to a bottom surface of the package substrate 500. Except for the afore-described features, the semiconductor package 1004 may have the same or substantially the same features as that described with reference to FIG. 6B.

In a semiconductor package according to an embodiment of the inventive concept, since a semiconductor chip structure is connected to an external device in a flip-chip bonding manner, signal transfer speed of the semiconductor package may be improved and integration density of the semiconductor package may be increased.

Since a semiconductor chip structure includes an image sensor chip, a logic chip, and a memory chip, it may improve an operation speed and may realize a fast reading function.

In a method of fabricating a semiconductor package according to an embodiment of the inventive concept, the WSS process may be performed just one time, and this may simplify the process. In addition, since a failed semiconductor chip is removed and only good semiconductor chips are attached to the transparent substrate, it may reduce loss of a transparent substrate and may improve a production yield.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor package, comprising:
preparing a semiconductor chip structure including an image sensor chip and a logic chip, which are in contact with each other;
forming a dam on a transparent substrate;
forming an adhesive layer on the dam;
attaching the semiconductor chip structure onto the dam using the adhesive layer; and
cutting the transparent substrate.

2. The method of claim 1, wherein the preparing of the semiconductor chip structure comprises:
attaching a first wafer comprising image sensor chip portions to a second wafer comprising logic chip portions to form a device substrate;
attaching the device substrate onto a carrier substrate;
performing a grinding process to remove a portion of the second wafer and to reduce a thickness of the second wafer while the first wafer and the second wafer are attached to the carrier substrate;
separating the device substrate from the carrier substrate; and
cutting the device substrate.

3. The method of claim 2, wherein the preparing of the semiconductor chip structure further comprises forming a through electrode and a redistribution pattern in the second wafer, before the separating of the device substrate from the carrier substrate.

4. The method of claim 3, wherein the preparing of the semiconductor chip structure further comprises forming an outer connection terminal on the redistribution pattern.

5. The method of claim 3, wherein the preparing of the semiconductor chip structure further comprises bonding a memory chip on the second wafer to be electrically connected to the redistribution pattern.

6. The method of claim 5, wherein the preparing of the semiconductor chip structure further comprises forming a mold layer to cover a sidewall of the memory chip.

7. The method of claim 2, wherein the preparing of the semiconductor chip structure further comprises testing the semiconductor chip structure.

8. The method of claim 1, wherein the transparent substrate comprises a chip region and a separation region which surrounds the chip region,
the dam is formed to cover both an edge of the chip region and the separation region, and
the cutting of the transparent substrate is performed to cut the dam and the adhesive layer on the separation region.

9. The method of claim 8, wherein, after the cutting of the transparent substrate, a lateral surface of the dam and a lateral surface of the adhesive layer are coplanar with a lateral surface of the transparent substrate.

10. The method of claim 1, wherein the transparent substrate comprises a chip region and a separation region which surrounds the chip region, and
the dam is formed to cover an edge of the chip region and not to overlap the separation region.

11. The method of claim 10, wherein, after the cutting of the transparent substrate, the dam and the adhesive layer are spaced apart from a lateral surface of the transparent substrate.

12. A method of fabricating a semiconductor package, comprising:
preparing a transparent substrate having a chip region and a separation region;
forming a dam on the chip region of the transparent substrate;
forming an adhesive layer covering a top surface and a lateral surface of the dam;
attaching a semiconductor chip structure onto the dam using the adhesive layer; and
cutting the transparent substrate to remove the separation region,
wherein, when viewed in a plan view, the dam, the adhesive layer, and the semiconductor chip structure are on the chip region of the transparent substrate, and
wherein, during the cutting of the transparent substrate, the dam and the adhesive layer are not cut.

13. The method of claim 12, wherein, after the cutting of the transparent substrate, a width of the transparent substrate is greater than a width of the semiconductor chip structure.

14. The method of claim 12, wherein, after the cutting of the transparent substrate, the dam and the adhesive layer are spaced apart from a lateral surface of the transparent substrate.

15. The method of claim 12, wherein, when viewed in a plan view, the separation region surrounds the chip region, and
the dam is formed to cover an edge of the chip region.

16. The method of claim 12, wherein the preparing of the semiconductor chip structure comprises:
attaching a first wafer comprising image sensor chip portions to a second wafer comprising logic chip portions to form a device substrate;
attaching the device substrate onto a carrier substrate;
performing a grinding process to remove a portion of the second wafer and to reduce a thickness of the second wafer;
separating the device substrate from the carrier substrate; and
cutting the device substrate.

17. A method of fabricating a semiconductor package, comprising:
preparing a transparent substrate having a chip region and a separation region;
forming a dam on the transparent substrate to cover both an edge of the chip region and the separation region;
forming an adhesive layer covering a top surface and a lateral surface of the dam;
attaching a semiconductor chip structure onto the dam using the adhesive layer; and
cutting the transparent substrate to remove the separation region,
wherein the cutting of the transparent substrate is performed to cut the dam and the adhesive layer on the separation region.

18. The method of claim 17, wherein, after the cutting of the transparent substrate, a width of the transparent substrate is greater than a width of the semiconductor chip structure.

19. The method of claim 17, wherein, after the cutting of the transparent substrate, a lateral surface of the dam and a lateral surface of the adhesive layer are coplanar with a lateral surface of the transparent substrate.

* * * * *